(12) United States Patent
Lee (10) Patent No.: US 6,721,513 B2
(45) Date of Patent: Apr. 13, 2004

(54) OPTICAL TELECOMMUNICATION MODULE

(75) Inventor: Sang-Ho Lee, Suwon-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 522 days.

(21) Appl. No.: 09/803,251

(22) Filed: Mar. 9, 2001

(65) Prior Publication Data

US 2001/0021054 A1 Sep. 13, 2001

(30) Foreign Application Priority Data

Mar. 10, 2000 (KR) ........................................ 2000-11926

(51) Int. Cl.⁷ ............................................... H04B 10/00
(52) U.S. Cl. ........................................ 398/164; 398/158
(58) Field of Search ................................. 398/164, 158, 398/201, 212

(56) References Cited

U.S. PATENT DOCUMENTS

| | | | |
|---|---|---|---|
| 4,719,358 A | * 1/1988 | Matsumoto et al. | 250/551 |
| 5,127,073 A | * 6/1992 | Mulholland et al. | 385/92 |
| 5,528,408 A | * 6/1996 | McGinley et al. | 398/139 |
| 5,535,034 A | * 7/1996 | Taniguchi | 398/139 |
| 5,566,265 A | * 10/1996 | Spaeth et al. | 385/93 |
| 5,631,987 A | * 5/1997 | Lasky et al. | 385/88 |
| 5,677,779 A | * 10/1997 | Oda et al. | 398/137 |
| 6,126,325 A | * 10/2000 | Yamane et al. | 385/92 |
| 6,369,924 B1 | * 4/2002 | Scharf et al. | 398/117 |

* cited by examiner

Primary Examiner—Hung N. Ngo
(74) Attorney, Agent, or Firm—Cha & Reiter, L.L.C.

(57) ABSTRACT

An optical telecommunication module capable of increasing the bandwidth and decreasing the RF return loss, comprising: a stem in which a laser diode and a photo-detector are disposed; a cap for protecting the laser diode and the photo-detector in the stem, the cap including a window formed on an upper part thereof; a common lead electrically connected to both the laser diode and the photo-detector; first and second leads electrically connected to the laser diode and the photo-detector, respectively; a dummy lead being electrically floated; and, a compensation element connected between the first lead and the dummy lead, wherein the compensation element having a predetermined resistance component and a predetermined inductance component.

12 Claims, 7 Drawing Sheets

OPTICAL TELECOMMUNICATION MODULE

CLAIM OF PRIORITY

This application claims priority to an application entitled "Optical Telecommunication Module" filed in the Korean Industrial Property Office on Mar. 10, 2000 and assigned Serial No. 2000-11926.

BACKGROUND OF THE INVENTION

1. Field of the Invention

The present invention relates generally to an optical telecommunication module, and in particular, to a low-speed TO-can type structure capable of extending bandwidth and minimizing RF return loss.

2. Description of the Related Art

Figure 1:
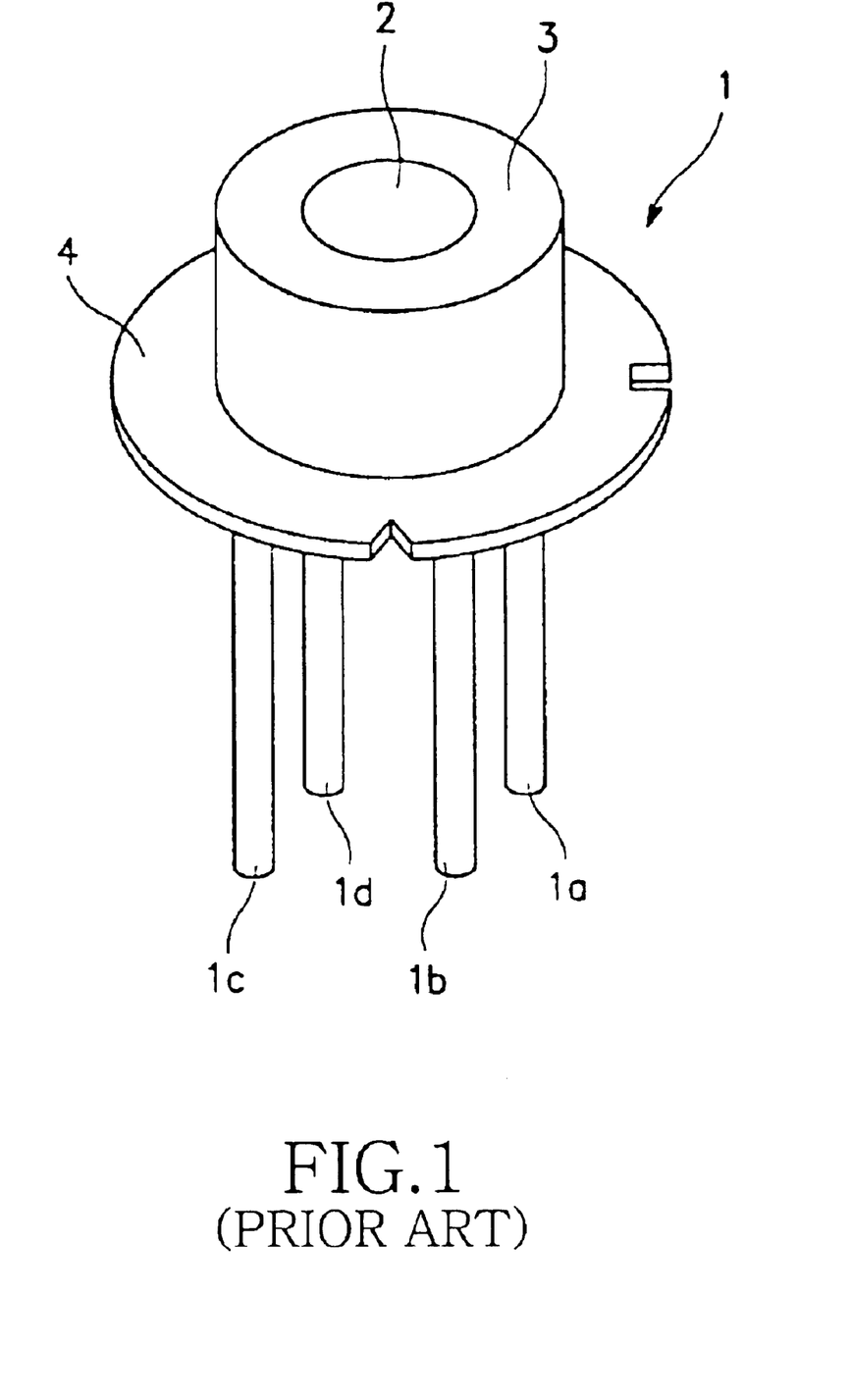
FIG. 1 is a perspective view illustrating a conventional TO-can type optical telecommunication module.

The conventional semiconductor laser apparatus utilizes a metal TO-can for packaging, and includes the formation of a "window" within a cap portion of the can through which the laser emission passes. FIG. 1 illustrates the conventional TO-can type optical telecommunication module. Enclosed within main body 1 is a laser diode and photo-detector (not shown), which are mounted on a stem member 4. The main body further includes a cap 3 mounted to the stem member 4. The cap 3 has a window 2 formed at the upper center thereof. Further, the stem member 4 includes a plurality of leads 1a, 1b, 1c and 1d connected to the laser diode and the photo-detector, and these leads are mounted on the bottom of the stem 4.

Figure 2:
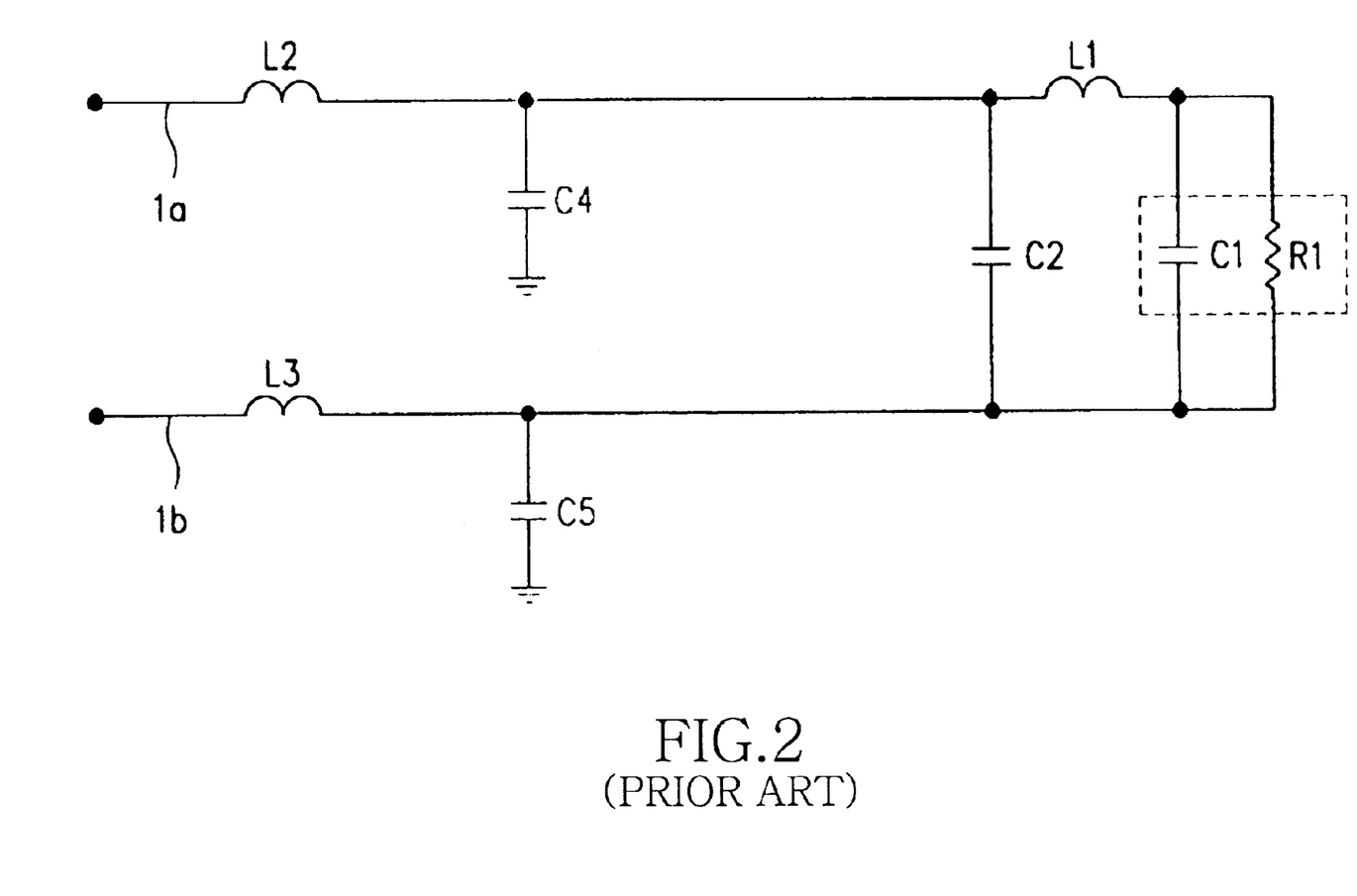
FIG. 2 is an equivalent diagram of the conventional optical telecommunication module shown in FIG. 1.

In such an optical structure, parasitic capacitance and inductance are typically generated around the wiring areas where the laser diode is connected to the leads. For the purpose of clarity, these generated parasitic capacitance and inductance are illustrated in terms of equivalent circuit elements in FIG. 2. Referring to FIG. 2, R1 and C1 represent the resistance and capacitance components generated in the laser diode, respectively. L1 represents an inductance of the bonding wire for connecting the laser diode to the lead 1a, and C2 indicates the capacitance generated in the sub-mounting member on which the laser diode and the photo-detector are mounted. Here, the sub-mounting member is enclosed in the main body 1. C4 and C5 indicate capacitances between the stem 4 and the leads 1a and 1b, respectively, whereas L2 and L3 indicate the inductance of the leads 1a and 1b, respectively.

Figure 3:
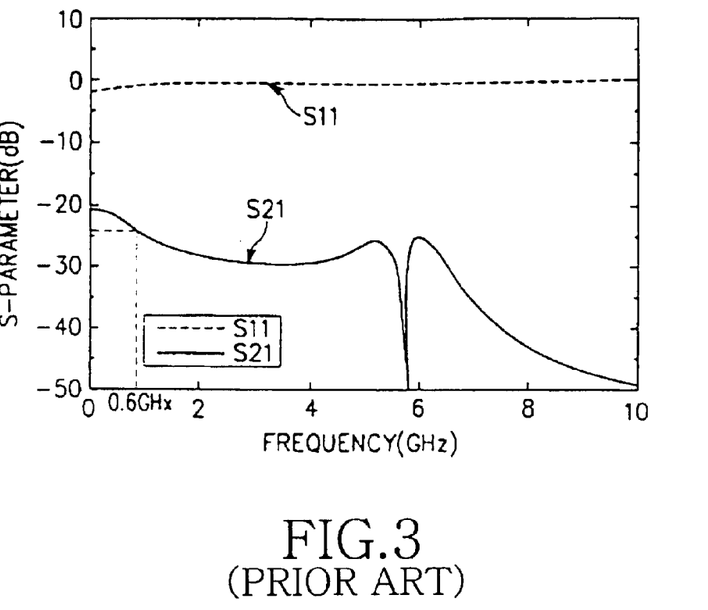
FIG. 3 is a graph illustrating a frequency-to-optical gain (S-parameter) characteristic of the conventional optical telecommunication module shown in FIG. 1.
Figure 4:
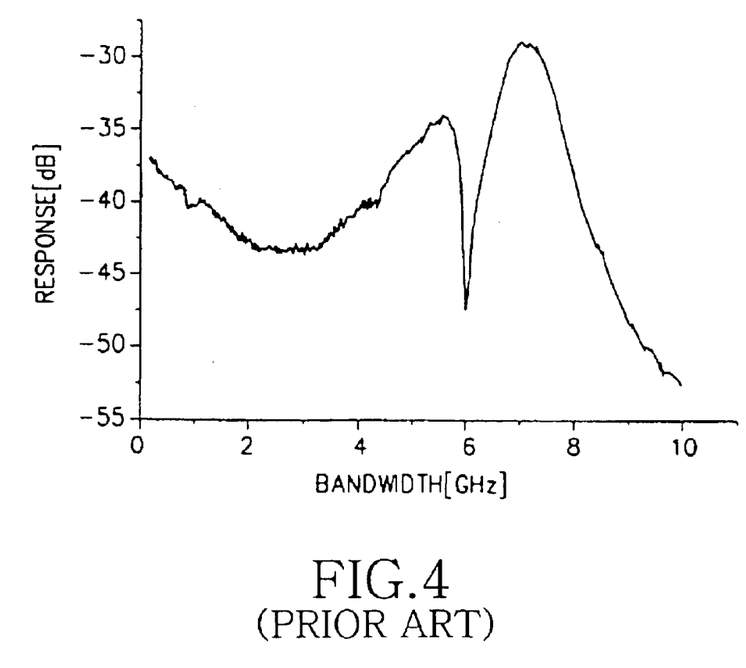
FIG. 4 is a graph illustrating a frequency-to-response characteristic of the conventional optical telecommunication module shown in FIG. 1.

Referring to FIGS. 3 and 4, in the above-described structure, a 3 dB bandwidth represented by line S21 and an Radio Frequency (RF) return loss represented by curve S11 are limited to 0.8 GHz and 0 dBm, respectively, due to the parasitic capacitance and inductance caused by the bonding connection between the laser diode and the leads. That is, the conventional TO-can type structure has a poor RF characteristic due to the parasitic capacitance in the packaging. As the 3 dB bandwidth is limited to 0.8 GHz, the conventional optical module can not be used as a high-speed module.

SUMMARY OF THE INVENTION

It is, therefore, an object of the present invention to provide an optical telecommunication module having an increased frequency response characteristic.

It is another object of the present invention to provide an optical telecommunication module capable of minimizing an RF return loss.

To achieve the above and other objects, there is provided an optical telecommunication module comprising; a stem in which a laser diode and a photo-detector are disposed thereon; a cap mounted on the stem for protecting the laser diode and the photo-detector and includes a window formed on an upper part thereof; a common lead electrically connected commonly to the laser diode and the photo-detector; first and second leads electrically connected to the laser diode and the photo-detector, respectively; a dummy lead being electrically floated; and, a compensation element connected between the first lead and the dummy lead, wherein the compensation element having a predetermined resistance component and a predetermined inductance component.

Preferably, the compensation element comprises a base having first and second holes through which the first lead and the dummy lead pass, respectively; a compensation resistance layer formed on the surface of the base; and, first and second conduction layers formed on the base for connecting both ends of the compensation resistance layer to the first lead and the dummy lead, respectively.

Preferably, the first lead is shorter in length than the dummy lead.

Preferably, the first lead is short in length than the dummy lead and connected to the first hole of the base.

Preferably, the compensation element has a resistance of 15 to 25Ω or over 40Ω.

BRIEF DESCRIPTION OF THE DRAWINGS

The above and other objects, features, and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. For the purpose of clarity, well-known functions or constructions are not described in detail as they would obscure the invention in unnecessary detail.

Figure 5:
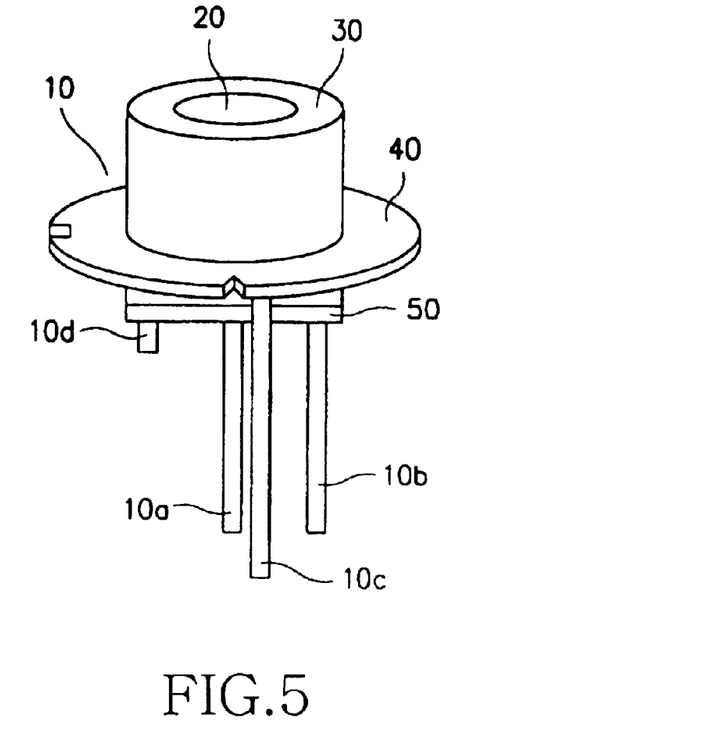
FIG. 5 is a perspective view illustrating a TO-can type optical telecommunication module according to an embodiment of the present invention.
Figure 6:
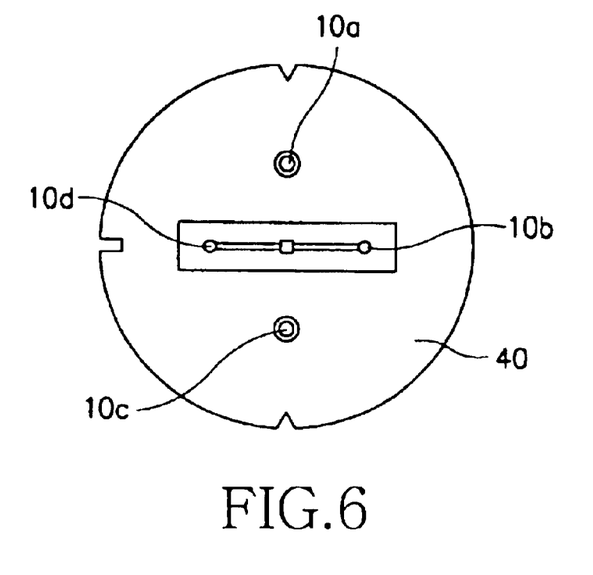
FIG. 6 is a bottom view of the optical telecommunication module shown in FIG. 5.
Figure 7:
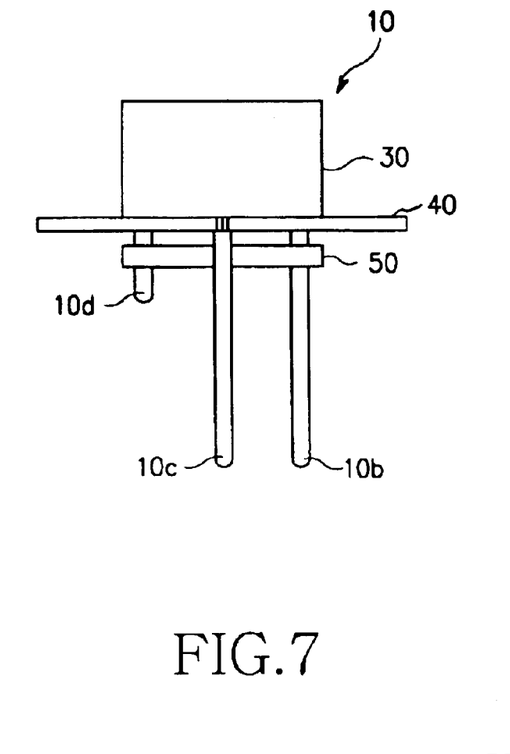
FIG. 7 is a side view of the optical telecommunication module shown in FIG. 5.

Referring to FIGS. 5 to 7, the TO-can type optical telecommunication module according to an embodiment of the present invention includes a main body 10 having a stem 40 in which a laser diode and a photo-detector (not shown) are included, and a cap 30 coupled to the stem 40. The cap 30 has a window 20 formed at the upper center through which the laser emission passes. The stem 40 includes a plurality of leads 10a, 10b, 10c and 10d that are mounted on the bottom thereof and connected to the laser diode and the photo-detector.

The lead 10a is a common lead connected to both cold terminals (or ground terminals) of the laser diode and the photo-detector, whereas a second lead 10c is connected to the hot terminal of the photo-detector. The lead 10b is a dummy lead, an electrically floated lead that is disconnected from both the laser diode and the photo-diode. The lead 10d is a first lead connected to the hot terminal of the laser diode and connected to the dummy lead 10b through a compensation element 50.

Figure 8:
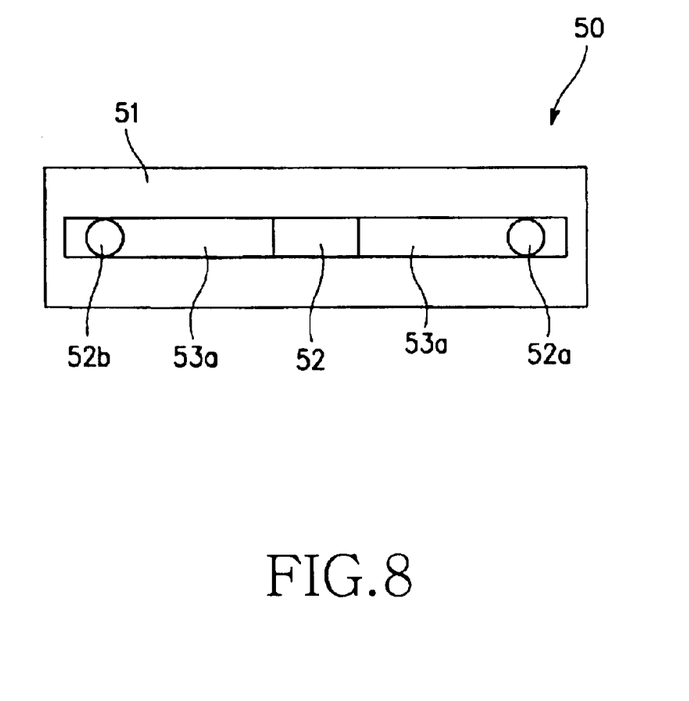
FIG. 8 is a plane view of a compensation element applied to the optical telecommunication module shown in FIG. 5.

Referring to FIG. 8, the compensation element 50 includes a compensation resistance layer 52 formed at the center of a base 51 made of a nonconducting material, such as ceramic. The first and second conduction layers 53a and 53b extended from both ends of the compensation resistance layer 52. The first and second conduction layers 53a and 53b are extended to cover the holes 52a and 52b formed at both sides of the base 51. Here, the compensation resistance layer 52 has a resistance of 15 to 20Ω or over 40Ω. It is preferable to use a chip resistor or a thin film resistor for the compensation resistance layer 52. Through the holes 52a and 52b, the dummy lead 10b and the first lead 10d are connected to the first and second conduction layers 53a and 53b, respectively.

Figure 9:
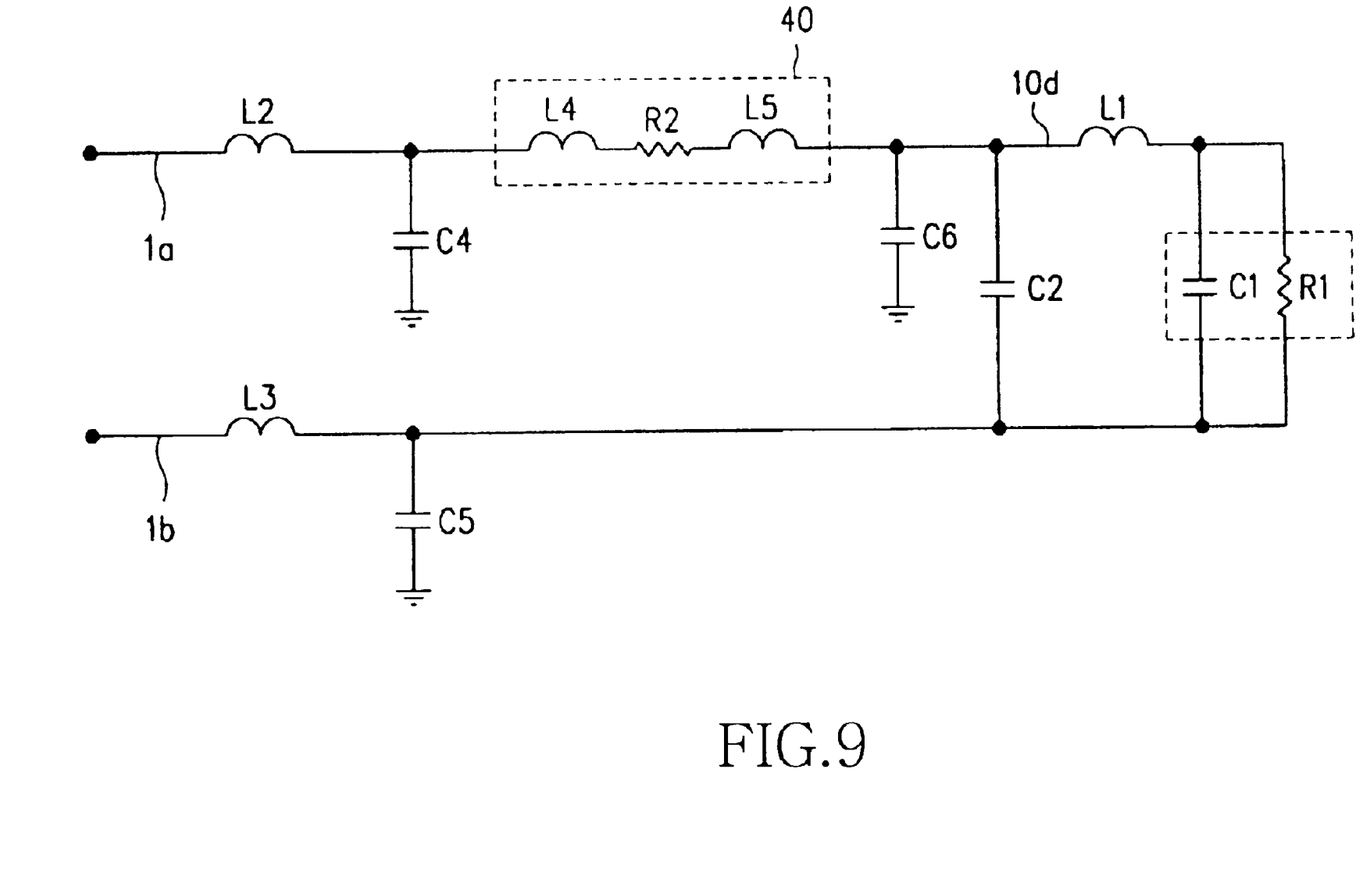
FIG. 9 is an equivalent diagram of the optical telecommunication module according to an embodiment of the present invention; and, FIG. 10 is a graph illustrating a frequency-to-optical gain (S-parameter) characteristic of the optical telecommunication module according to an embodiment of the present invention.

The optical telecommunication module, as described in the preceding paragraphs, has an equivalent circuit diagram shown in FIG. 9.

Referring to FIG. 9, R1 and C1 indicate resistance and capacitance components generated in the laser diode. L1 indicates the inductance of a bonding wire that is used for connecting the laser diode to the first lead 10d. C2 indicates the capacitance generated in a sub-mounting member on which the laser diode and the photo-detector are mounted, and the sub-mount is enclosed by the main body 10. C4 indicates the capacitance between the dummy lead 10b and the stem 40. C5 indicate the capacitance between the common lead 10a and the stem 40. L2 and L3 indicate inductances of the dummy lead 10b and the common lead 10a, respectively. C6 indicates the capacitance between the first lead 10d and the stem 40. R2, L4 and L5 indicate resistance and inductances of the compensation element 50. More specifically, R2 indicates the resistance of the compensation resistance layer 52, and L4 and L5 indicate inductances of the first and second conduction layers 53a and 53b, respectively.

Figure 10:
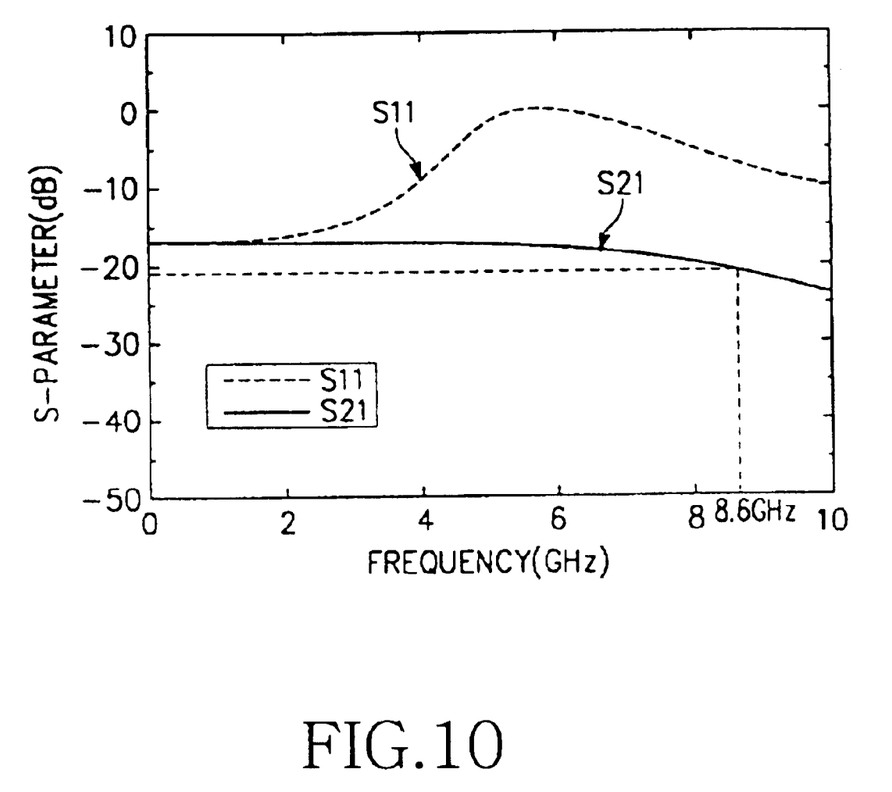

FIG. 10 shows the frequency-to-S parameter characteristic of the optical telecommunication module according to an embodiment of the present invention. As shown in FIG. 10, it is possible to increase the 3 dB bandwidth S21 over 8 GHz range by performing impedance matching through the compensation element 50, and decrease the RF return loss S11 to below −10 dBm. Therefore, the novel optical telecommunication module configured as shown in FIGS. 5–8 can be used as a 2.5 Gbps uncooled module, thus significantly contributing to a reduction in price of the module and enhance the price competitiveness in the optical telecommunication system.

By minimizing the length of the first lead 10d connected to the dummy lead 10b, it is possible to minimize the inductance caused by the first lead 10d, thereby making it possible to further increase the RF characteristic.

It can be appreciated that the TO-can type optical telecommunication module according to the present invention can be externally impedance-matched using the compensation element, thus making it possible to increase the frequency response characteristic. That is, as the impedance matching is performed by the compensation element disposed in the exterior of the package, it is possible to increase the existing 3 dB bandwidth of 0.8 GHz to over 8 GHz and decrease the RF return loss from the existing 5 dB to below 10 dB. Therefore, the inventive novel module can be substituted for the existing high-priced 2.5 Gbps DFB and EML modules which helps to the price competitiveness in the telecommunication system using the present invention. In addition, the inventive module can also be applied to the IMT-2000 (2.2 GHz) system.

While the invention has been shown and described with reference to a certain preferred embodiment thereof, it will be understood by those skilled in the art that various changes in form and details may be made therein without departing from the spirit and the scope of the invention as defined by the appended claims.

What is claimed is:

1. An optical telecommunication module, comprising:

a stem in which a laser diode and a photo-detector are disposed;

a cap for protecting the laser diode and the photo-detector and mounted the stem, the cap including a window formed on an upper part thereof;

a common lead electrically connected commonly to the laser diode and the photo-detector;

first and second leads electrically connected to the laser diode and the photo-detector, respectively;

a dummy lead being electrically floated; and, a compensation element connected between the first lead and the dummy lead, the compensation element having a predetermined resistance component and a predetermined inductance component.

2. The optical telecommunication module as claimed in claim 1, wherein the compensation element comprises:

a base having first and second holes through which the first lead and the dummy lead pass, respectively;

a compensation resistance layer formed on a surface of the base; and first and second conduction layers formed on the base for connecting both ends of the compensation resistance layer to the first lead and the dummy lead, respectively.

3. The optical telecommunication module as claimed in claim 1, wherein the first lead is substantially shorter in length than the dummy lead.

4. The optical telecommunication module as claimed in claim 2, wherein the first lead is substantially shorter in length than the dummy lead and connected to the first hole of the base.

5. The optical telecommunication module as claimed in claim 1, wherein the compensation element has a resistance of 15 to 25Ω.

6. The optical telecommunication module as claimed in claim 2, wherein the compensation element has a resistance of 15 to 25Ω.

7. The optical telecommunication module as claimed in claim 3, wherein the compensation element has a resistance of 15 to 25Ω.

8. The optical telecommunication module as claimed in claim 4, wherein the compensation element has a resistance of 15 to 25Ω.

9. The optical telecommunication module as claimed in claim 1, wherein the compensation element has a resistance of over 40Ω.

10. The optical telecommunication module as claimed in claim 2, wherein the compensation element has a resistance of over 40Ω.

11. The optical telecommunication module as claimed in claim 3, wherein the compensation element has a resistance of over 40Ω.

12. The optical telecommunication module as claimed in claim 4, wherein the compensation element has a resistance of over 40Ω.

* * * * *